(12) United States Patent
Lasiter et al.

(10) Patent No.: US 11,228,086 B2
(45) Date of Patent: Jan. 18, 2022

(54) ANTENNA PACKAGE AND CONFIGURATION FOR MILLIMETER WAVE

(71) Applicant: QUALCOMM Incorporated, San Diego, CA (US)

(72) Inventors: Jon Lasiter, Stockton, CA (US); Ravindra Vaman Shenoy, Dublin, CA (US); Mohammad Ali Tassoudji, San Diego, CA (US); Seong Heon Jeong, San Diego, CA (US); Jeremy Darren Dunworth, La Jolla, CA (US)

(73) Assignee: Qualcomm Incorporated, San Diego, CA (US)

( * ) Notice: Subject to any disclaimer, the term of this patent is extended or adjusted under 35 U.S.C. 154(b) by 785 days.

(21) Appl. No.: 16/004,466

(22) Filed: Jun. 11, 2018

(65) Prior Publication Data

US 2019/0379102 A1 Dec. 12, 2019

(51) Int. Cl.
*H01Q 1/22* (2006.01)
*H01Q 21/06* (2006.01)
*H01L 23/66* (2006.01)
*H01Q 9/06* (2006.01)

(52) U.S. Cl.
CPC ........... *H01Q 1/2283* (2013.01); *H01L 23/66* (2013.01); *H01Q 9/065* (2013.01); *H01Q 21/062* (2013.01); *H01L 2223/6677* (2013.01)

(58) Field of Classification Search
CPC ...... H01Q 1/2283; H01Q 9/065; H01L 23/66; H01L 2223/6677
See application file for complete search history.

(56) References Cited

U.S. PATENT DOCUMENTS

| | | | |
|---|---|---|---|
| 2014/0118216 A1* | 5/2014 | Rofougaran | H01Q 3/242 343/861 |
| 2019/0123425 A1* | 4/2019 | Jeong | H01Q 9/285 |
| 2019/0288371 A1* | 9/2019 | Kamgaing | H01Q 9/0457 |
| 2020/0412022 A1* | 12/2020 | Yun | H01Q 9/0457 |

\* cited by examiner

*Primary Examiner* — Dameon E Levi
*Assistant Examiner* — Amal Patel
(74) *Attorney, Agent, or Firm* — Qualcomm Incorporated

(57) ABSTRACT

An antenna package comprising a chip package including a plurality of feed lines, a first half antenna subassembly electrically coupled to the feed lines, and a second half antenna subassembly electrically coupled to the feed lines, wherein the first and second half antenna subassemblies point away from each other in a direction substantially perpendicular to the chip package. The antenna subassemblies may be millimeter (mm) wave antennas covering from approximately 24 to 43.5 GHz. The antenna subassemblies include a flex substrate formed from printed circuit boards (PCB) or flex-film PCB.

18 Claims, 4 Drawing Sheets

ANTENNA PACKAGE AND CONFIGURATION FOR MILLIMETER WAVE

BACKGROUND

Field

Aspects of the present disclosure relate to antennas in wireless communications and, more particularly, to antenna packages and configurations covering from approximately 24 to 43.5 GHz.

Background

Fifth generation cellular networks, commonly referred to as 5G, are expected to include frequencies in the range from approximately 24 to 43.5 GHz for mobile devices. The frequencies in this range are referred to as millimeter (mm) wave frequencies because their free space wavelengths are approximately 10 millimeters or less. The frequencies from approximately 24 to 43.5 GHz may be divided into segments depending on frequency band(s) licensed in a country or regions. For example, the U.S. has allocated frequency bands such as 27.5-28.35 GHz, 37-38.6 GHz, and 38.6-40 GHz for licensed use. Europe is considering frequency bands such as 24.25-27.5 GHz, 31.8-33.4 GHz, and 40.5-43.5 GHz. China is conducting compatibility studies for frequency bands of 24.25-27-5 GHz and 37-43.5 GHz. Currently, each frequency segment is handled by an individual RFIC (radio frequency integrated circuit)/antenna package. Current package designs used for the mm wave applications have several key issues including, for example, there is limited space within a mobile device, operation is limited to a single frequency segment, and fractional bandwidth of the antenna package is typically less than 20%. As such, there is a need for antenna packages and configurations covering from approximately 24 to 43.5 GHz. In addition, the antenna packages and configurations should provide at least similar or better performance to traditional antenna design, provide reduced package thickness, conform to limited space within a mobile device, and provide for increased fractional bandwidth.

SUMMARY

The following presents a simplified summary of one or more aspects or embodiments to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An antenna package according to one aspect is described. The antenna package comprises a chip package including a plurality of feed lines, a first half antenna subassembly electrically coupled to the feed lines, and a second half antenna subassembly electrically coupled to the feed lines, wherein the first and second half antenna subassemblies point away from each other in a direction substantially perpendicular to the chip package. The antenna subassemblies may be millimeter (mm) wave antennas covering from approximately 24 to 43.5 GHz. The antenna subassemblies include a flex substrate formed from printed circuit boards (PCB) or flex-film PCB.

A method for providing an antenna package according to one aspect is described. The method comprises providing a chip package including a plurality of feed lines, forming a first half antenna subassembly electrically coupled to the feed lines, and forming a second half antenna subassembly electrically coupled to the feed lines, wherein the first and second half antenna subassemblies point away from each other in a direction substantially perpendicular to the chip package.

These and other aspects of the invention will become more fully understood upon a review of the detailed description, which follows. Other aspects of the invention will become apparent to those of ordinary skill in the art, upon reviewing the following description of specific, exemplary aspects of the invention in conjunction with the accompanying figures.

DETAILED DESCRIPTION

The detailed description set forth below, in connection with the appended drawings, is intended as a description of exemplary aspects and is not intended to represent the only aspects in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
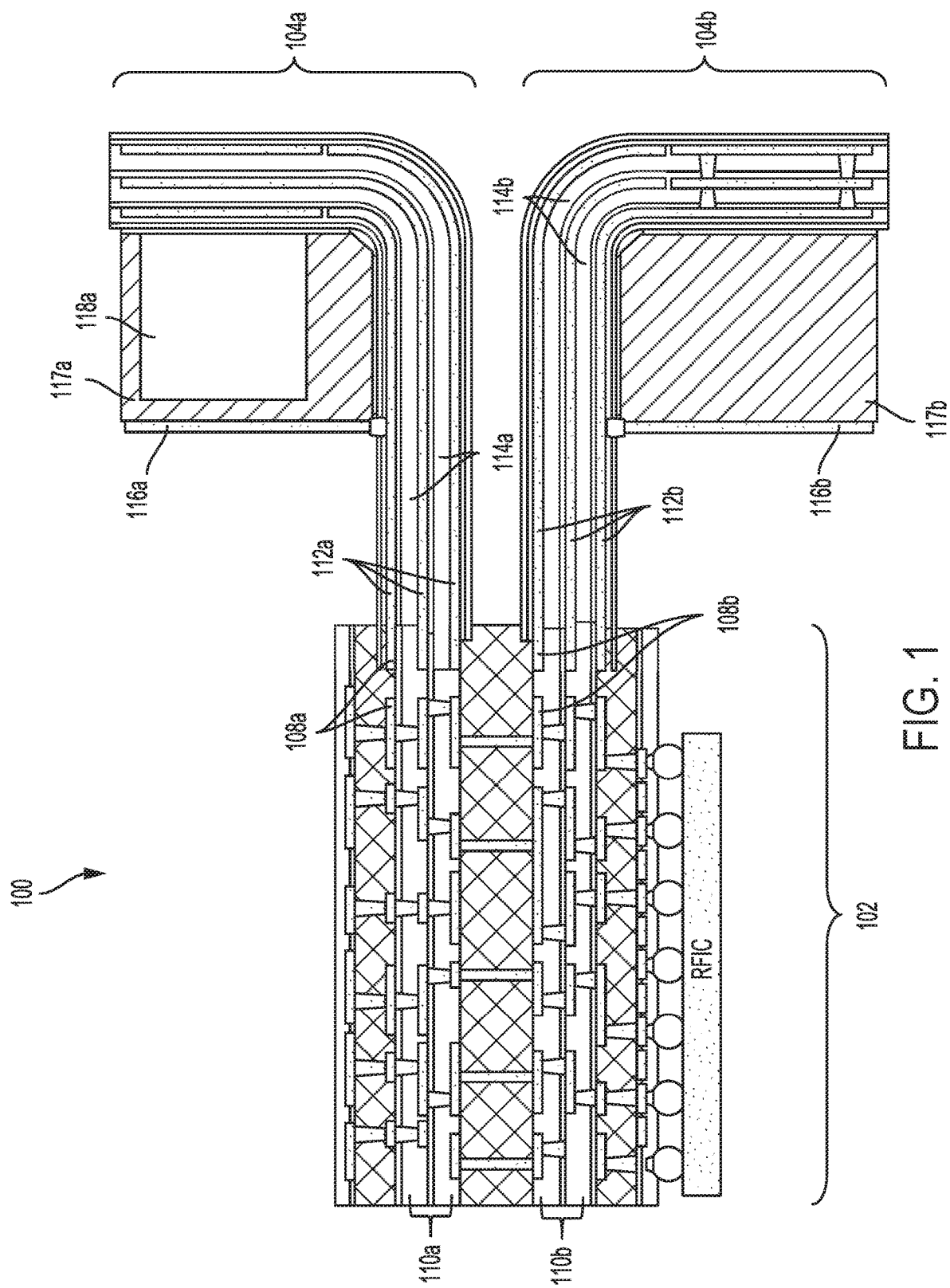
FIG. 1 shows an antenna package 100 according to one aspect of the invention.

Referring to FIG. 1, there is shown an antenna package 100 according to one aspect of the invention. Antenna package 100 includes a chip package 102 and two antenna subassemblies 104a and 104b that form a "butterfly" shape. In one aspect, the antenna subassemblies 104a and 104b include a flex substrate formed from printed circuit boards (PCB) including, e.g., rigid PCB, flexible PCB, flex-film. PCB, etc., with the two antenna subassemblies 104a and 104b being on opposed sides of the chip package 102. The chip package 102 includes a plurality of feed lines having characteristic impedance. The characteristic impedance of the feed lines should match the characteristic impedance of the antenna elements implemented in the antenna subassemblies 104a and 104b. Antenna subassemblies 104a and 104b may point to different directions, for example up and down as shown in FIG. 1. Antenna subassemblies 104a and 104b may comprise a plurality of antenna elements which will be described in more detail in reference to FIGS. 2a-2e. For example, antenna subassembly 104a may comprise a plurality of first half dipoles and antenna subassembly 104b may comprise a plurality of second half dipoles. The first half dipoles may be pointing up and the second half dipoles may be pointing down as shown in FIG. 1. It is important to note that the peak direction of radiation for antenna elements implemented in antenna subassemblies 104a and 104b may be perpendicular to the direction the dipoles are pointing. That is, for antenna subassemblies 104a and 104b, the peak direction of radiation would be to the right as shown in FIG. 1.

Each of antenna subassemblies 104a and 104b may be L-shaped projecting outwardly from the chip package 102 with their legs parallel to each other, and are arranged to form a "butterfly" shape dipole antenna package 100. Antenna elements on antenna subassemblies 104a and 104b may be fed by transmission lines with characteristic impedance of the feed lines as described above. In one aspect, the half dipoles are in a direction perpendicular to the chip package 102. As discussed above, the chip package 102 includes feed lines for antenna elements in antenna subassemblies 104a and 104b. The feed lines may include, for example, conductors 108a and 108b, and transmission lines 110a and 110b. Similarly, antenna subassemblies 104a and 104b may include conductors 112a and 112b, respectively, and transmission lines 114a and 114b, respectively. Conductors 108a and 108b of chip package 102 maybe be electrically coupled to conductors 112a and 112b of antenna subassemblies 104a and 104b, respectively. Similarly, transmission lines 110a and 110b of chip package 102 maybe be electrically coupled to transmission lines 114a and 114b of antenna subassemblies 104a and 104b, respectively. In another aspect, chip package 102 may further include a feed network having transmission lines for coupling to and feeding antenna subassemblies 104a and 104b. The feed network may be at least one of a stripline feed network, microstrip lines, and other transmission line types. Other aspects include other types and/or geometries of feed networks. The transmission lines may be microwave transmission lines, and may be carried by a subassembly, member, or medium (e.g., flex film, dielectric layer, etc.). For example, the transmission lines may distribute, transfer, and/or receive RF signals to and/or from antenna elements in antenna subassemblies 104a and 104b. The transmission lines may be any suitable transmission lines carried by any suitable network medium. The transmission lines may be copper etched on a thick polyester film.

Antenna subassembly 104a may further comprise a solid stiffener 117a and a ground plane 116a incorporated into the solid stiffener 117a as shown in FIG. 1. Similarly, antenna subassembly 104ba may further comprise a solid stiffener 117b and a ground plane 116b incorporated into the solid stiffener 117b. That is, in one aspect, both antenna subassemblies 104a and 104h are backed by solid stiffeners 117a and 117b, respectively. In another aspect, both antenna subassemblies 104a and 104b may be backed by solid stiffeners 117a and 117b including air cavity 118a (air cavity not shown in stiffener 117b). The antenna configuration of the disclosure may support multiple frequency bands, for example, the bands of 27.5-28.35 GHz, 37-38.6 GHz, and 38.6-40 GHz in the U.S. In another example, the antenna configuration may support the bands of 24.25-27.5 GHz, 31.8-33.4 GHz, and 40.5-43.5 GHz in Europe. In yet another example, the antenna configuration may support the bands of 24.25-27-5 GHz and 37-43.5 GHz in China. In yet another example, the antenna configuration may support all frequency bands from 24.25-43.5 GHz providing a single SKU (stock keeping unit) for all three regions including the U.S., Europe, and China. The antenna configuration of the disclosure provides at least similar or better performance to traditional antenna design, provides reduced package thickness, conform to limited space within a mobile device, and provides for increased fractional bandwidth.

Figure 2A:
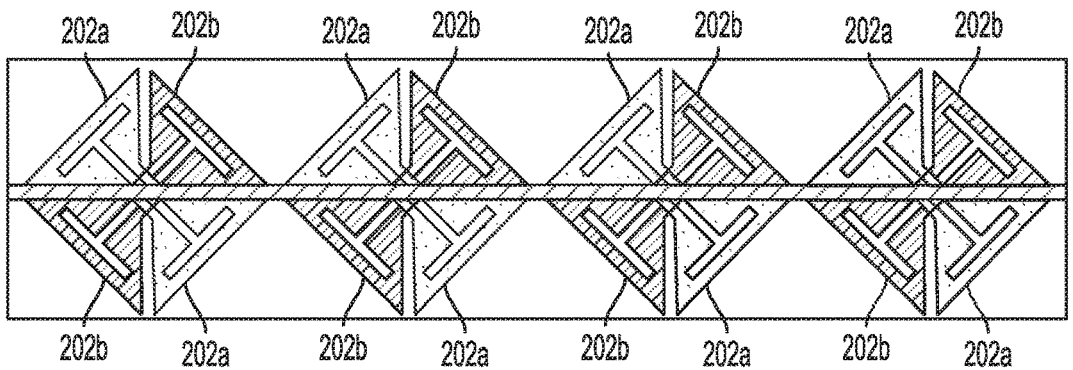
FIG. 2a-2e show different antenna configurations that may be implemented according to different aspects the invention.
Figure 2B:
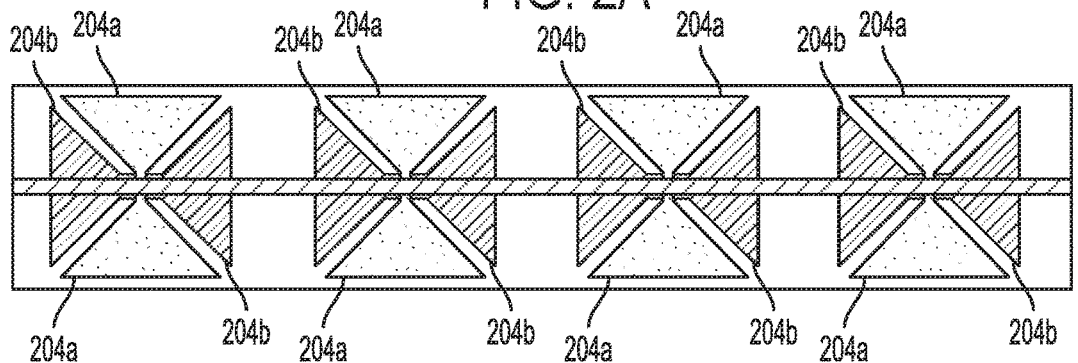
Figure 2C:
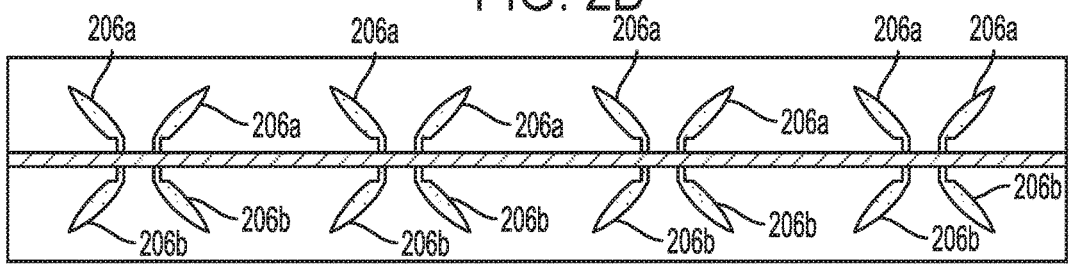
Figure 2D:
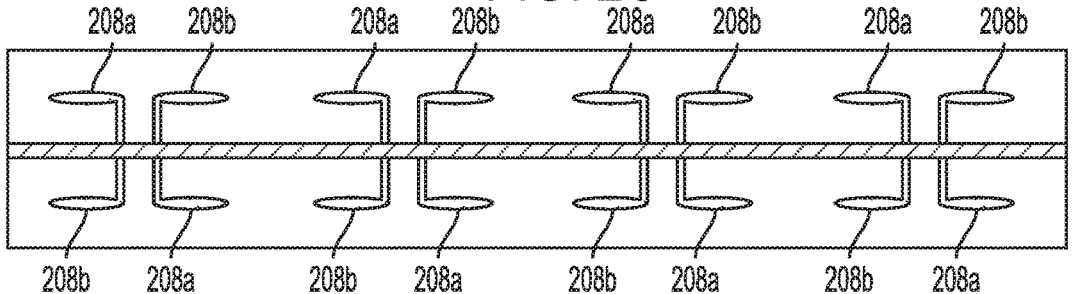
Figure 2E:
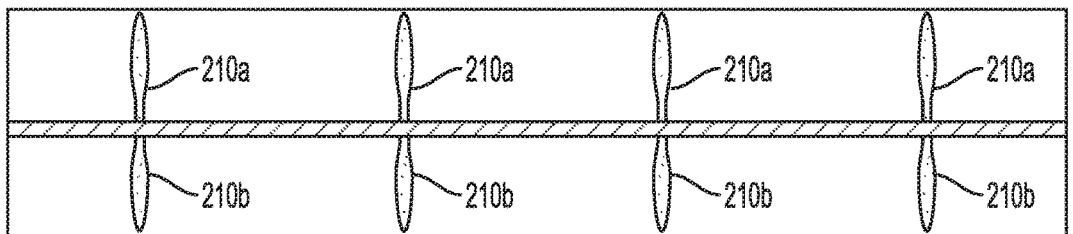

Referring to FIGS. 2a-2e, there are shown different antenna array configurations that may be implemented with the antenna package of FIG. 1. FIGS. 2a-2d show dual polarization antennas and FIG. 2e shows vertical polarization antennas according to exemplary aspects of the invention. Individual antenna elements 202a, 202h, 204a, 206b, 206a, 206b, 208a, 208b, 210a, and 201b represent different antenna elements that can be implemented, e.g., on the outward facing surface of antenna subassemblies 104a and 104b. The dual polarization and vertical polarization antennas may be formed by the metal patterns implemented in the antenna subassembly, and exemplary patterns are shown in FIGS. 2a-2e. The antenna elements may be fed by transmission line antennas as previously described in reference to FIG. 1. The dipoles may include dual polarized antennas or antenna elements as further described below. The radiation pattern, radiation resistance, and directivity are dependent upon, among other things, the length, size, shape, and/or geometry of the antenna elements or dipoles. Frequency may be tuned, e.g., by adjusting the length of each of the antenna elements or dipoles.

Referring to FIG. 2a, there is shown one configuration of 4 dual polarization antennas. The 4 dual polarization antennas include 4 pairs of first half dipoles 202a, and 4 pairs of second half dipoles 202b. Within each pair of half dipoles 202a and 202b, one-half of the dipoles is implemented in upper antenna subassembly 104a and one-half of the dipoles is implemented in lower antenna subassembly 104b. Each of the half dipoles 202a and 202b may have a "T" cut-out of the dipole antenna to generate, e.g., a desired radiation pattern to tune a desired frequency band(s). Referring to FIG. 2b, there is shown another configuration of 4 dual polarization antennas. The 4 dual polarization antennas include 4 pairs of first half dipoles 204a, and 4 pairs of second half dipoles 204b. The configuration of FIG. 2b is similar to that of FIG. 2a except the half dipoles 204a and 204b are rotated 90° and do not have a "T" cut-out in the dipole antennas. Additionally, half of each of the half dipoles 204a may be implemented in upper antenna subassembly 104a and the other half of each of the half dipoles 204b may be implemented in lower antenna subassembly 104b. Referring to FIG. 2c, there is shown another configuration of 4 dual polarization antennas that is "propeller" shaped. The 4 dual polarization antennas include 4 pairs of first half dipoles 206a, and 4 pairs of second half dipoles 206b. More specifically, each pair of dipoles includes a first leg (first half dipole 206a) and a second leg (second half dipole 206a) that together with second pair of dipoles with first leg (first half dipole 206b) and second leg (second half dipole 206b) forms a "propeller" shaped antenna. Within each pair of half dipoles 206a and 206b, one half of the half dipoles may be implemented in upper antenna subassembly 104a and one half of the half dipoles may be implemented in lower antenna subassembly 104b. Referring to FIG. 2d, there is shown a configuration of 4 dual polarization antennas including 4 pairs of first vertical dipoles 208a, and 4 pairs of second vertical dipoles 208b. Referring to FIG. 2e, there is shown another configuration of 4 vertical polarization antennas including 4 first vertical half dipoles 210a, and 4 second vertical half dipoles 210b. In FIG. 2e, one first vertical half dipole 210a in upper antenna subassembly 104a may be paired with an adjacent second vertical half dipole 210b in lower antenna subassembly 104b to form a dipole antenna. Each of the configurations shown in FIGS. 2a-2e provides a desired radiation pattern in the desired frequency band(s).

Figure 3:
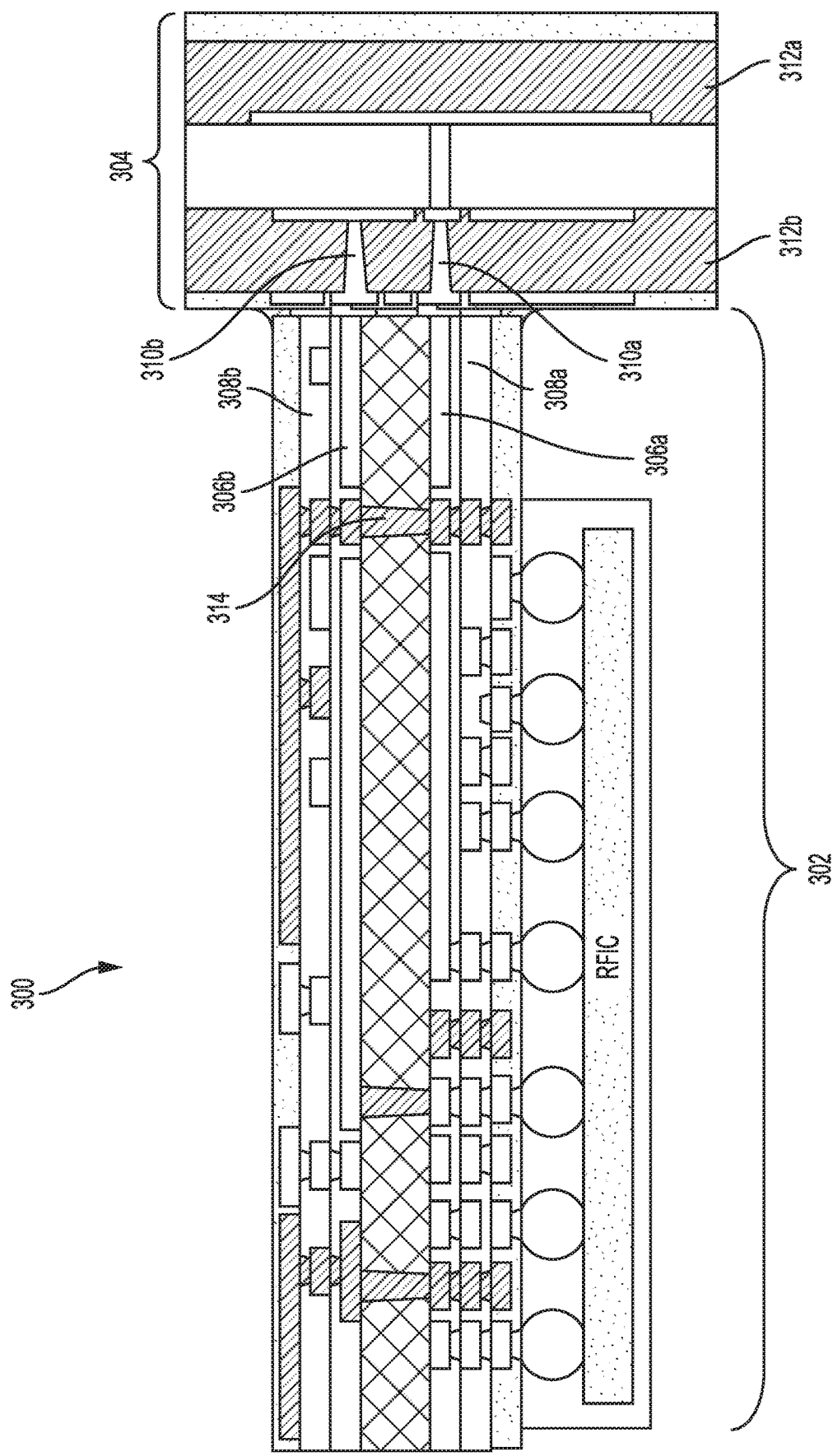
FIG. 3 shows an antenna package 300 according to one aspect of the invention.

Referring to FIG. 3, there is shown an antenna package 300 according to one aspect of the invention. Antenna package 300 includes an RFIC chip package 302 and antenna subassembly 304 that is substantially perpendicular to the RFIC chip package 302. In one aspect, the RFIC chip package 302 may be rigid and may be formed from printed circuit boards (PCB) including, e.g., rigid PCB, flexible PCB, flex-film PCB, etc. RFIC chip package 302 may include a plurality of feed lines having a characteristic impedance. The characteristic impedance of the feed lines should match the impedance of antenna elements implemented on antenna subassembly 304. Antenna elements implemented on antenna subassembly 304 may be millimeter (mm) wave antennas, and may be dipoles, probe-fed patch antennas or aperture-fed patch antennas. In one aspect, antenna elements implemented on antenna subassembly 304 are in a direction substantially parallel to each other, and substantially perpendicular to the RFIC chip package 302 as mentioned above. The feed lines of RFIC chip package 302 may include, for example, conductors 306a/306b, and transmission lines 308a/308b. Similarly, antenna subassembly 304 may include conductors 310a/310b, which may be implemented as traces and/or vias, and dielectric regions 312a/312b. Conductors 306a/306b of RFIC chip package 302 maybe be electrically coupled to conductors 310a/310b of antenna subassembly 304, respectively. The RFIC chip package 302 may further include ground vias 314. The antenna configuration of the disclosure may support multiple frequency bands, for example, the bands of 27.5-28.35 GHz, 37-38.6 GHz, and 38.6-40 GHz in the U.S. In another example, the antenna configuration may support the bands of 24.25-27.5 GHz, 31.8-33.4 GHz, and 40.5-43.5 GHz in Europe. In yet another example, the antenna configuration may support the bands of 24.25-27-5 GHz and 37-43.5 GHz in China. In yet another example, the antenna configuration may support all frequency bands from 24.25-43.5 GHz providing a single SKU (stock keeping unit) for all three regions including the U.S., Europe, and China. The antenna configuration of the disclosure provides at least similar or better performance to traditional antenna design, provides reduced package thickness, conform to limited space within a mobile device, and provides for increased fractional bandwidth.

Figure 4:
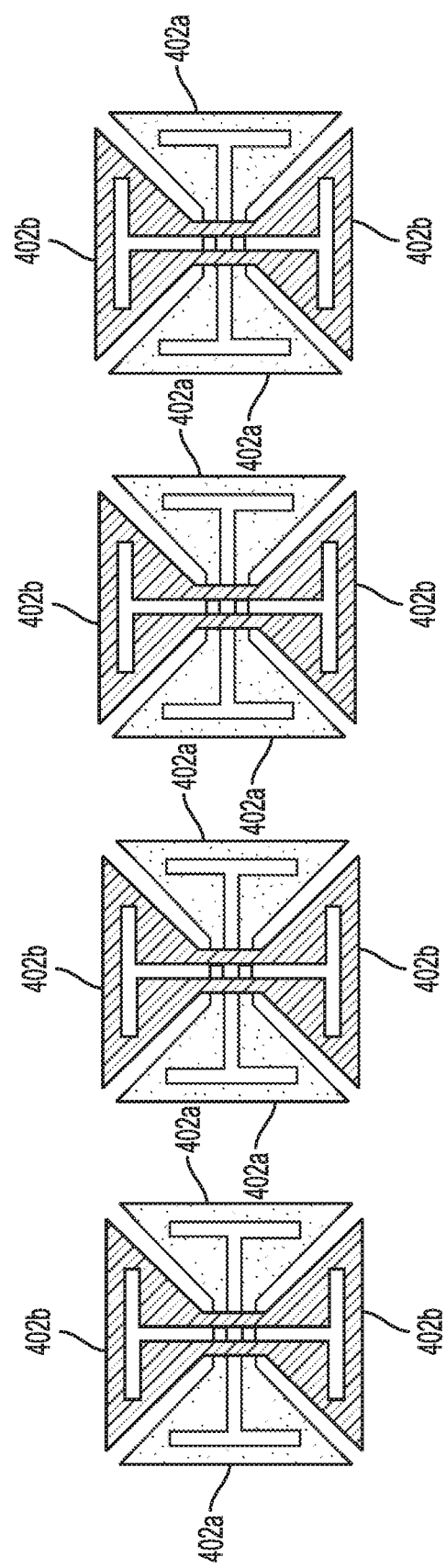
FIG. 4 shows antenna configurations that may be implemented according to one aspect of the invention.

Referring to FIG. 4, there is shown an antenna configuration 400 that may be implemented with the antenna package of FIG. 3 according to one aspect of the invention. FIG. 4 shows a configuration of 4 dual polarization antennas including 4 pairs of first half dipoles 402a, and 4 pairs of second half dipoles 402b. Each of the half dipoles 402a and 402b may have a "T" cut-out of the dipole antennas to generate, e.g., a desired radiation pattern to tune a desired frequency band(s). The dipole antennas may be fed, e.g., by quasi differential transmission lines fed into positive and negative feeds for the pairs of dipoles. The radiation pattern, radiation resistance, and directivity are dependent upon, among other things, the length, size, shape, and/or geometry of the antenna elements 402a and 402b. Antenna elements 402a and 402b may be associated with different frequency bands. As discussed above, frequency may be tuned, e.g., by adjusting the length of each of the antenna elements or dipoles.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:
1. An antenna package, comprising:
a chip package including a plurality of feed lines,
a first antenna subassembly electrically coupled to the feed lines, and
a second antenna subassembly electrically coupled to the feed lines,
wherein each of the first and second antenna subassemblies further comprises antenna elements on an outward facing surface of the first and second antenna subassemblies, wherein the antenna elements and the feed lines have impedances that substantially match, wherein the first and second antenna subassemblies point away from each other in a direction substantially perpendicular to the chip package, wherein the first antenna subassembly comprises a plurality of first half dipoles, and wherein the first antenna subassembly is bent in an upward direction.

2. The antenna package of claim 1, wherein the second antenna subassembly comprises a plurality of second half dipoles.

3. The antenna package of claim 1, wherein the first and second antenna subassemblies are millimeter (mm) wave antennas covering from approximately 24 to 43.5 GHz.

4. The antenna package of claim 2, wherein the second antenna subassembly is bent in a downward direction.

5. The antenna package of claim 1, wherein the first and second antenna subassemblies include a flex substrate formed from printed circuit boards (PCB) or flex-film PCB.

6. The antenna package of claim 1, wherein the first and second half antenna subassemblies are etched into printed circuit boards (PCB).

7. The antenna package of claim 5, wherein the flex substrate of the first and second half antenna subassemblies are L-shaped projecting outward from the chip package.

8. The antenna package of claim 5, wherein the flex substrate of the first and second half antenna subassemblies have legs that are parallel to each other.

9. The antenna package of claim 1, wherein each of the first and second half antenna subassemblies further comprises a stiffener.

10. The antenna package of claim 9, wherein each of the first and second half antenna subassemblies further comprises a ground plane incorporated into the stiffener.

11. The antenna package of claim 9, wherein the stiffener is solid.

12. The antenna package of claim 9, wherein the stiffener includes an air cavity.

13. A method for providing an antenna package comprising:
providing a chip package including a plurality of feed lines;
forming a first half antenna subassembly electrically coupled to the feed lines; and
forming a second half antenna subassembly electrically coupled to the feed lines;
forming antenna elements on an outward facing surface of the first and second half antenna subassemblies,
wherein the antenna elements and the feed lines have impedances that substantially match,
wherein the first and second half antenna subassemblies point away from each other in a direction substantially perpendicular to the chip package,
wherein the first and second half antenna subassemblies include a flex substrate formed from printed circuit boards (PCB) or flex-film PCB, and
wherein the flex substrate of the first and second half antenna subassemblies are L-shaped projecting outward from the chip package.

14. The method of claim 13, wherein the first and second half antenna subassemblies are formed by etching into printed circuit boards (PCB).

15. An antenna package, comprising:
a chip package including a plurality of feed lines,
a first half dipole antenna subassembly electrically coupled to the feed lines, and
a second half dipole antenna subassembly electrically coupled to the feed lines,
wherein each of the first and second half dipole antenna subassemblies further comprises antenna elements on an outward facing surface of the first and second half dipole antenna subassemblies,
wherein the antenna elements and the feed lines have impedances that substantially match,
wherein the first and second half dipole antenna subassemblies are substantially parallel to each other in a direction substantially perpendicular to the chip package,
wherein the first and second half dipole antenna subassemblies include a flex substrate formed from printed circuit boards (PCB) or flex-film PCB, and
wherein the flex substrate of the first and second half dipole antenna subassemblies are L-shaped projecting outward from the chip package.

16. The antenna package of claim 15, wherein the first and second half dipole antenna subassemblies are millimeter (mm) wave antennas covering from approximately 24 to 43.5 GHz.

17. The antenna package of claim 15, wherein the chip package includes a rigid RFIC chip package.

18. The antenna package of claim 17, wherein the RFIC chip package further comprises ground vias.

* * * * *